United States Patent
Malik et al.

(10) Patent No.: US 6,790,739 B2
(45) Date of Patent: Sep. 14, 2004

(54) STRUCTURE AND METHODS FOR PROCESS INTEGRATION IN VERTICAL DRAM CELL FABRICATION

(75) Inventors: Rajeev Malik, Pleasantville, NY (US); Larry Nesbit, Williston, VT (US); Jochen Beintner, Wappingers Falls, NY (US); Rama Divakaruni, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,997

(22) Filed: May 27, 2003

(65) Prior Publication Data

US 2003/0186502 A1 Oct. 2, 2003

Related U.S. Application Data

(62) Division of application No. 09/895,672, filed on Jun. 29, 2001, now Pat. No. 6,620,676.

(51) Int. Cl.⁷ .............................................. H01L 21/20
(52) U.S. Cl. ...................... 438/386; 438/243; 257/301
(58) Field of Search ................................ 438/243, 386; 257/301

(56) References Cited

U.S. PATENT DOCUMENTS

| | | | |
|---|---|---|---|
| 4,816,884 A | 3/1989 | Hwang et al. | 357/23.6 |
| 4,833,516 A | 5/1989 | Hwang et al. | 357/23.6 |
| 5,225,363 A | 7/1993 | Riemenschneider et al. | 437/47 |
| 5,365,097 A | 11/1994 | Kenney | 257/302 |
| 5,396,093 A | 3/1995 | Lu | 257/306 |
| 5,433,794 A * | 7/1995 | Fazan et al. | 148/33.3 |
| 5,541,427 A * | 7/1996 | Chappell et al. | 257/306 |
| 5,627,092 A | 5/1997 | Alsmeier et al. | 438/152 |
| 5,869,392 A * | 2/1999 | Kimura | 438/620 |
| 5,953,607 A | 9/1999 | Hakey et al. | 438/249 |
| 6,025,245 A | 2/2000 | Wei | 438/386 |
| 6,136,686 A | 10/2000 | Gambino et al. | 438/624 |
| 6,153,902 A | 11/2000 | Furukawa et al. | 257/301 |
| 6,174,756 B1 | 1/2001 | Gambino et al. | 438/163 |
| 6,222,218 B1 | 4/2001 | Jammy et al. | 257/301 |
| 6,228,711 B1 | 5/2001 | Hsieh | 438/255 |
| 6,238,961 B1 * | 5/2001 | Asano et al. | 438/197 |
| 6,287,913 B1 * | 9/2001 | Agnello et al. | 438/241 |
| 6,403,423 B1 * | 6/2002 | Weybright et al. | 438/279 |

* cited by examiner

Primary Examiner—Amir Zarabian
Assistant Examiner—Jeff Vockrodt
(74) Attorney, Agent, or Firm—Lisa Ulrich; Cantor Colburn LLP

(57) ABSTRACT

A method for processing a semiconductor memory device is disclosed, the memory device including an array area and a support area thereon. In an exemplary embodiment of the invention, the method includes removing, from the array area, an initial pad nitride material formed on the device. The initial pad nitride material in the support area, however, is still maintained. Active device areas are then formed within the array area, wherein the initial pad nitride maintained in the support area helps to protect the support area from wet etch processes implemented during the formation of active device areas within the array area.

10 Claims, 16 Drawing Sheets

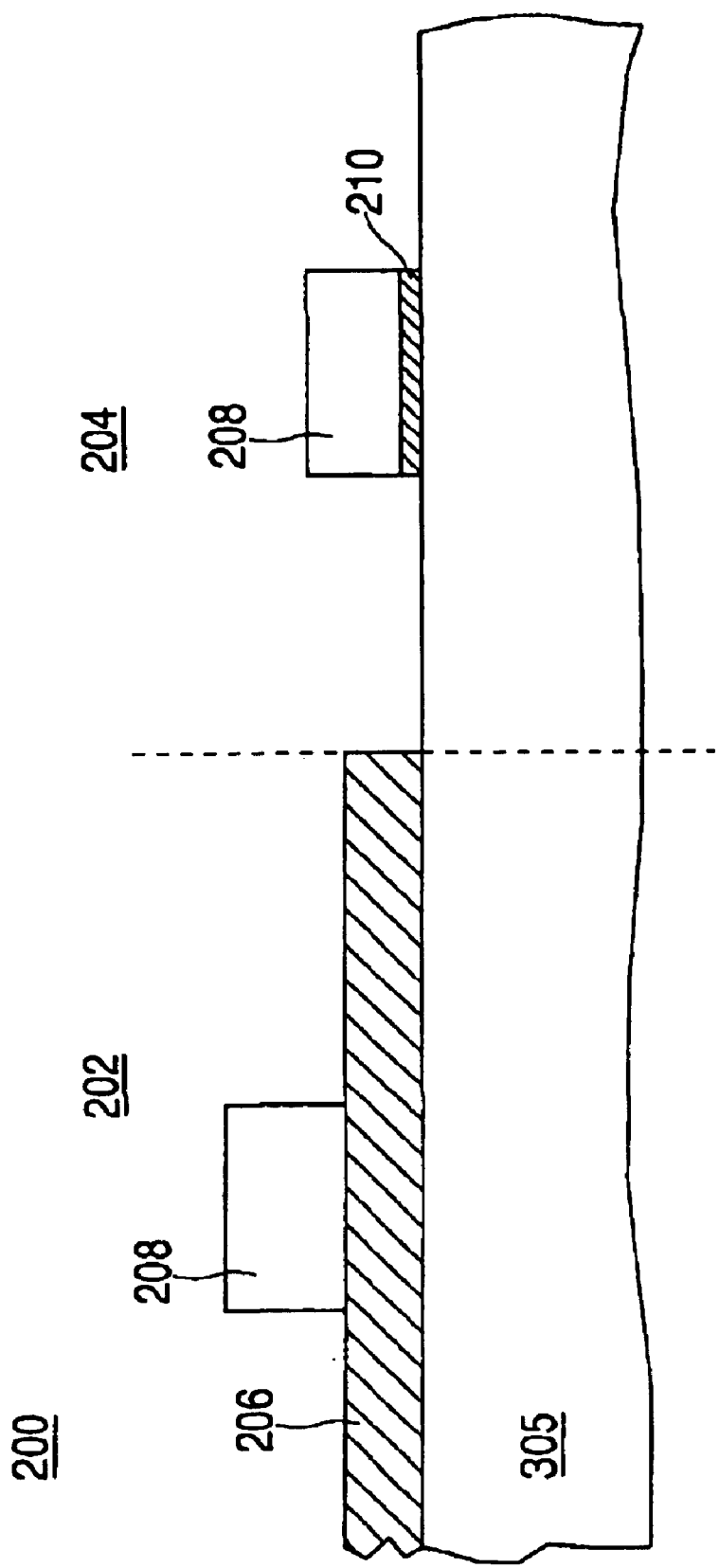

STRUCTURE AND METHODS FOR PROCESS INTEGRATION IN VERTICAL DRAM CELL FABRICATION

CROSS REFERENCE TO RELATED APPLICATIONS

This application is a divisional application of U.S. Ser. No. 09/895,672, filed Jun. 29, 2001, now U.S. Pat. No. 6,620,676 the disclosures of which are incorporated by reference herein in their entirety.

BACKGROUND OF INVENTION

The present invention relates generally to semiconductor device processing and, more particularly, to methods for processing array and support areas of a vertical DRAM cell device.

The manufacture and design of integrated circuits has greatly increased in sophistication in recent years, particularly in regard to the increase of integration density. Increased integration density leads to economic advantages as increased numbers of devices and circuits may be placed on a single chip and/or within a single package (which may include a plurality of chips). Performance improvements such as reduced signal propagation time and noise immunity can usually be achieved as integration density is increased due to reduction in length of signal paths, capacitance between connections and the like. This performance gain is particularly important in integrated circuits.

Integrated circuits such as dynamic random access memories (DRAMs) can have millions of similar devices on a single chip (often collectively referred to as an array or array portion of the chip design) which are controlled throughout the chip or partitions thereof by circuits such as addressing circuits, sense amplifiers and the like, generally referred to as support circuits. Unfortunately, the circuit requirements are generally different for the array and support regions of the chip, and ideally would require different processes during manufacture. For example, junctions with self-aligned silicides (salicides) are desired in the support regions to minimize series resistance. On the other hand, shallow junctions with low dose implants and no silicides are desired in the array in order to minimize junction leakage.

As another example, during conventional processing of the array, an array top oxide is deposited and certain portions are thereafter removed. Generally, the top oxide is removed entirely from the support area. (See, for example, R. Divakaruni et al. "In ULSI Process Integration II", Electrochemical Society Proceeding Vol. [2001]-2) However, existing wet etch processes may cause shallow trench isolation (STI) areas within the support area to be exposed to overetching thereof which, in turn, may lead to voids at the trench edges, gate shorts and the like.

SUMMARY OF INVENTION

The foregoing discussed drawbacks and deficiencies of the prior art are overcome or alleviated by a method for processing a semiconductor memory device, the memory device including an array area and a support area thereon. In an exemplary embodiment of the invention, the method includes removing, from the array area, an initial pad nitride material formed on the device. The initial pad nitride material in the support area, however, is still maintained. Active device areas are then formed within the array area, wherein the initial pad nitride maintained in the support area or the initial nitride layer added helps to protect the support area from chemical mechanical polish or wet etch processes respectively implemented during the formation of active device areas within the array area.

In a preferred embodiment, the method includes forming a first cap oxide over the support area, the first cap oxide preventing the removal of the initial pad nitride material contained within the support area during the removal of the initial pad nitride material contained within the array area. Following the formation of active device areas within the array area, a cap nitride is formed over the array area. A second cap oxide is formed over the cap nitride, and the initial pad nitride material contained within the support area is removed. The second cap oxide prevents the removal of the cap nitride formed over the array area.

BRIEF DESCRIPTION OF DRAWINGS

Referring to the exemplary drawings wherein like elements are numbered alike in the several Figures:

FIG. 16 is a partial cross-sectional view of a semiconductor device which may be formed through the described embodiments of the invention.

DETAILED DESCRIPTION

Figure 1:
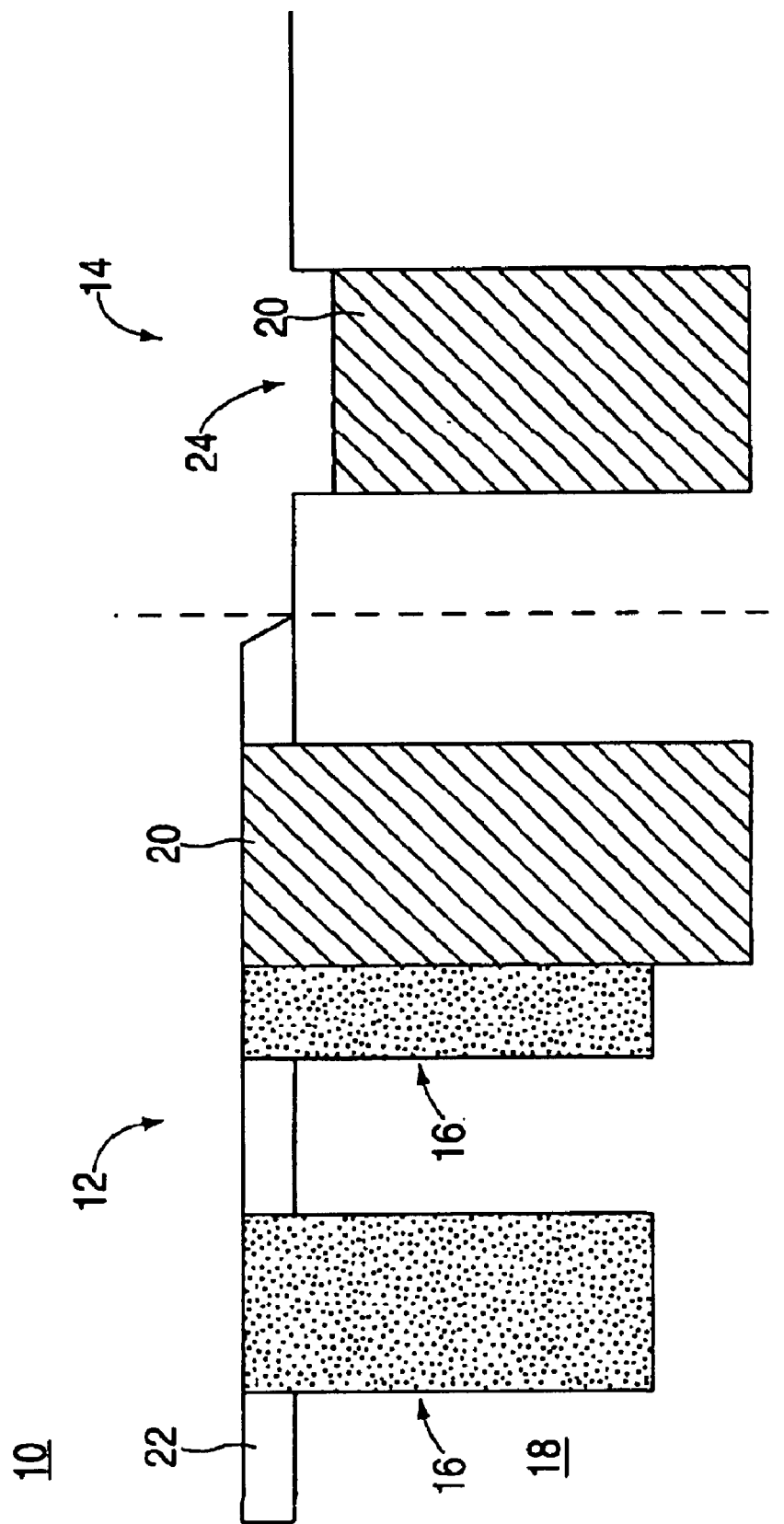
FIG. 1 is a cross-sectional view of both array and support areas of a DRAM device processed in a conventional manner, specifically illustrating a divot formation within an isolation trench in the support area.

Referring initially to FIG. 1, there is shown a cross-sectional view of both array and support areas of a DRAM device processed in a conventional manner. In particular, device 10 includes an array area 12 and a support area 14. The array area 12 features the individual memory cells in a DRAM array (the individual cells including a storage capacitor and a MOS transistor). In the embodiment depicted, the storage capacitor and transistor (not shown) for each memory cell is formed within a deep vertical trench (DT) 16 in the substrate 18 of the device 10. For purposes of illustration, only the topmost portion of the deep trenches 16 is shown. A shallow trench isolation (STI) or isolation trench (IT) 20 is shown adjacent one of the deep trenches in the array area 12 of device 10. Isolation trench 20 serves to provide isolation between active areas of the DRAM device 10. In addition, the support area 14 also includes isolation trenches 20 to provide isolation between active areas therein.

In the conventional processing of trench-based DRAM devices, an array top oxide layer (ATO) 22 is formed over the wafer. The ATO 22 is subsequently removed from the support area 14 for further device processing in that area. However, because of the wet etch process conventionally used in removing oxide layers, the isolation trenches 20 within the support area 14 (being filled with an oxide material) are also susceptible to wet etching. As a result, a portion of the isolation trench may also be removed, thereby forming a void or divot 24. This, in turn, may ultimately have adverse effects in terms of device shorting, thereby resulting in overall lower device yield.

Therefore, in accordance with an embodiment of the invention, there is disclosed a method for processing a semiconductor memory device, the memory device including an array area and a support area thereon, wherein the removal of a pad nitride from the array area and the support area is processed separately. In so doing, certain aspects of the array processing (e.g., spacer formation within the top portion of the deep trenches) may be carried out, with minimal wet etch exposure of isolation trench regions in the support area.

Figure 2:
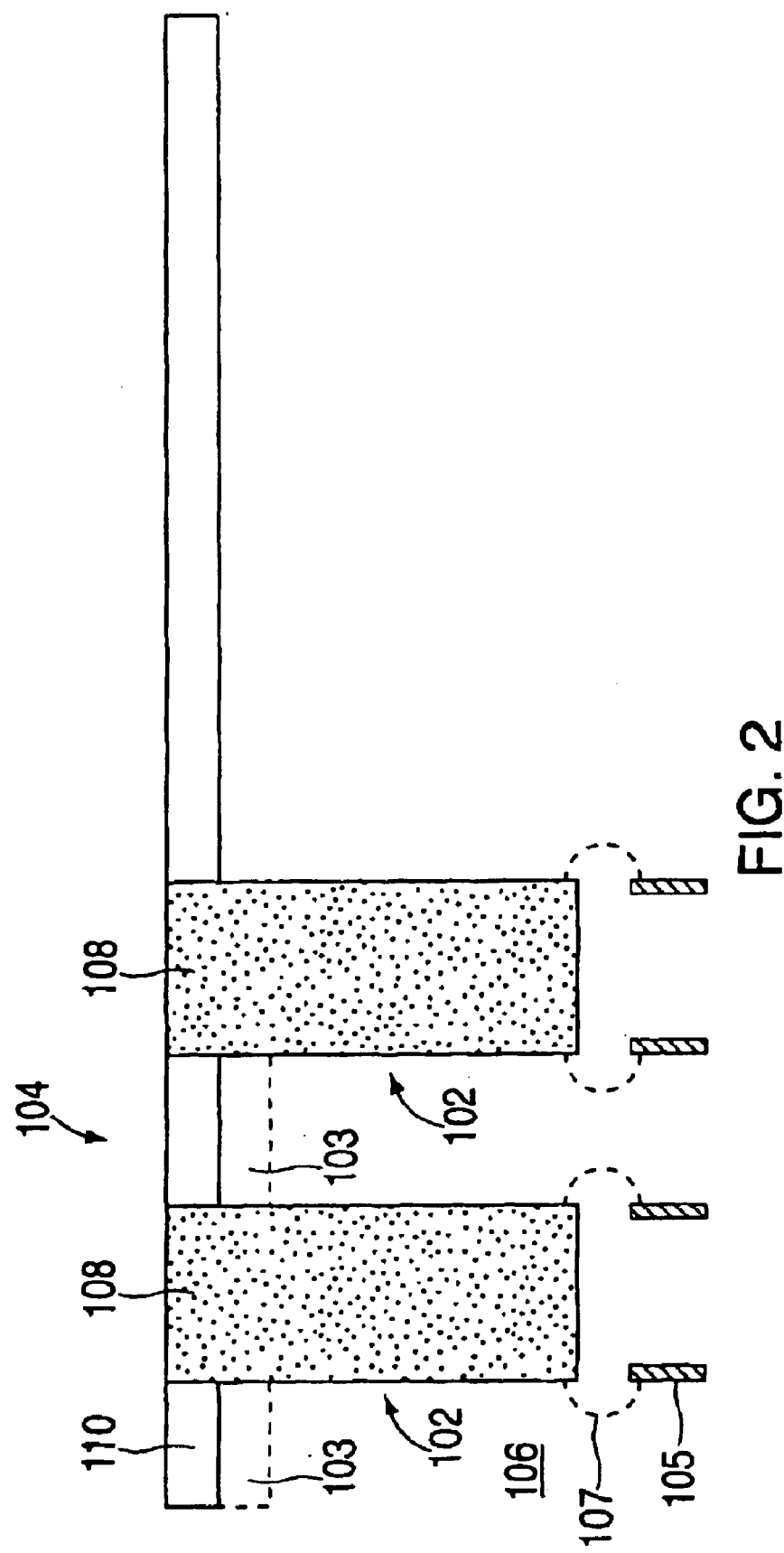
FIGS. 2 through 13 are partial cross-sectional views of both array and support areas of a DRAM device during various stages of the processing thereof, in accordance with an embodiment of the invention.

Referring now to FIG. 2, there is shown a pair of exemplary deep trenches 102 formed within a DRAM array area 104 of a semiconductor wafer substrate 106. A thick nitride layer 110 is deposited upon the substrate 106. The deep trenches 102 are then patterned, etched and filled with a polygate material 108 (e.g., silicon) which material 108 is then planarized down to the nitride layer 110. By way of illustration, FIG. 2 also shows a bitline junction 103, which is connected to one of the diffusions of the FET structures included in each DRAM memory cell. In addition, a collar oxide 105 is located below the transistor portion of deep trenches 102 to prevent outward leakage of charge stored within the capacitor (not shown) located in the lower portion of trench 102. A buried strap 107 is fabricated early in the process and has a diffused connection formed by creating a sidewall contact on an edge of the trench capacitor. The bitline junction 103, collar oxide 105 and buried strap 107 are included in FIG. 2 to illustrate the general relationship between the transistor and capacitor within the deep trench 102 and are not shown in subsequent Figures.

Figure 3:
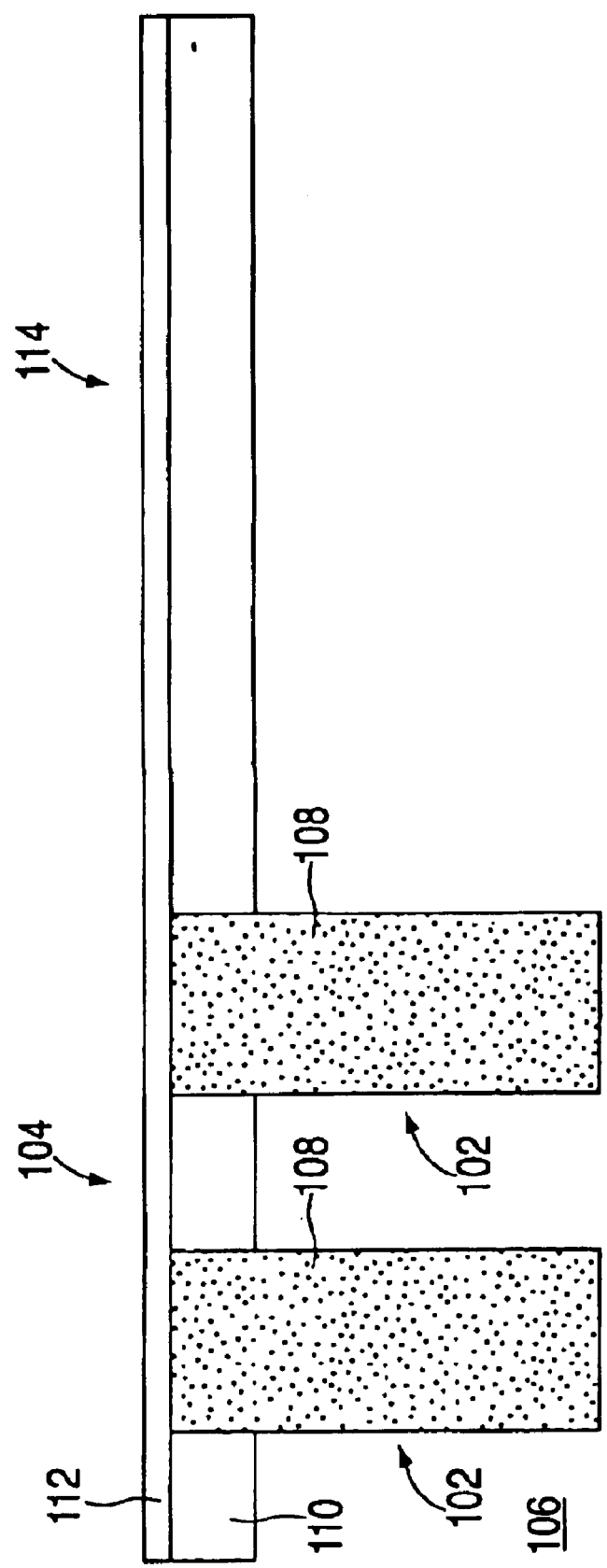
Figure 4:
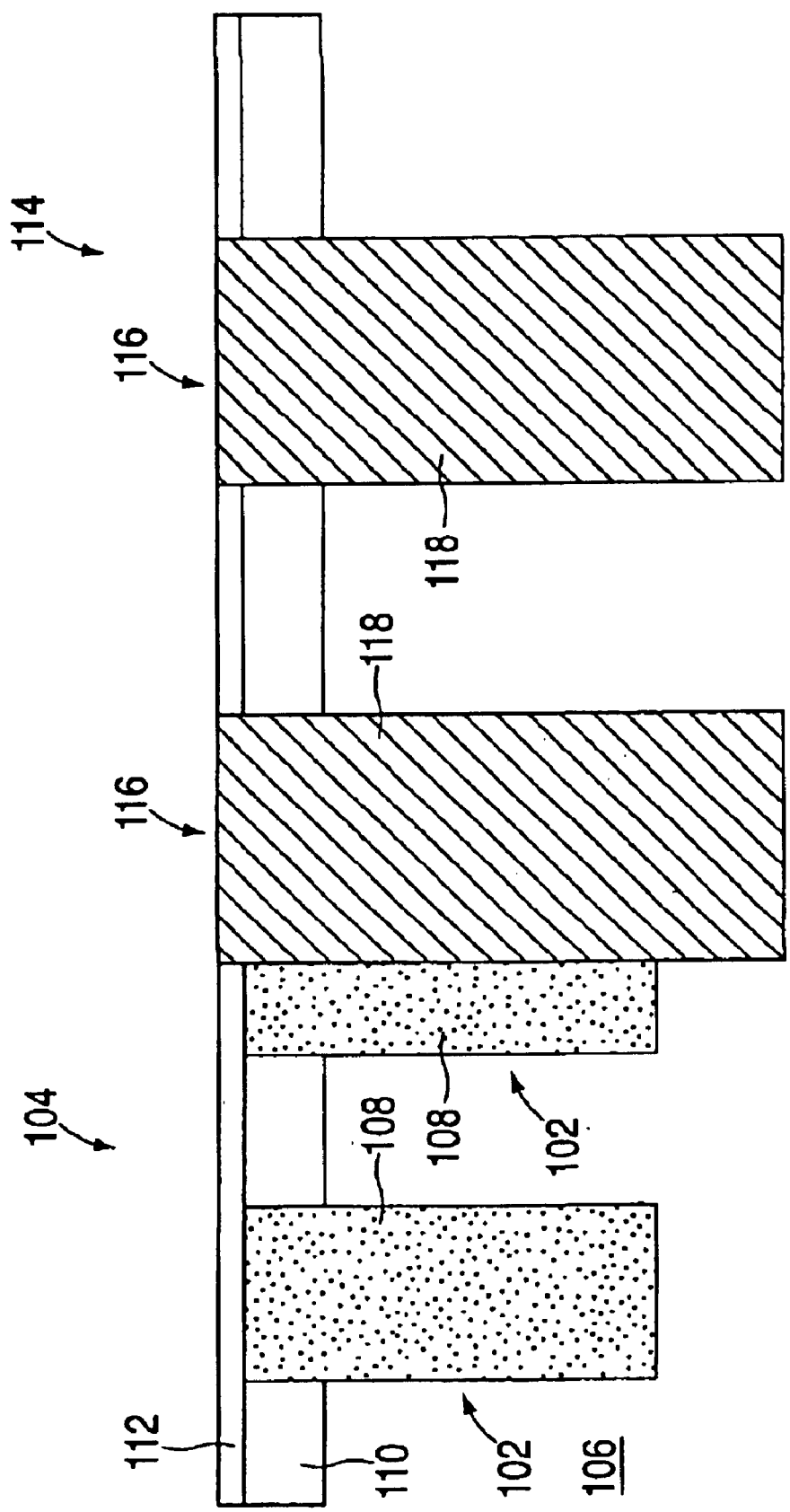

Following the formation of trenches 102, a pad nitride 112 is then deposited over the entire wafer surface, including the support area 114 of the wafer, as shown in FIG. 3. FIG. 4 illustrates the shallow trench isolation (STI) formation, within both the array 104 and support 114 areas. STI areas 116 are patterned and formed through conventional photolithography techniques, after which portions of the nitride layers 110, 112 and the substrate 106 are removed by etching to form the isolation trenches 118. After a liner is prepared within the isolation trenches by oxidation, the isolation trenches 118 are then filled with an oxide fill (e.g., a high density plasma (HDP) oxide fill). The isolation trenches 118 extend above the substrate 106, roughly equivalent to the thickness of the nitride and pad nitride layers 110, 112.

Figure 5:
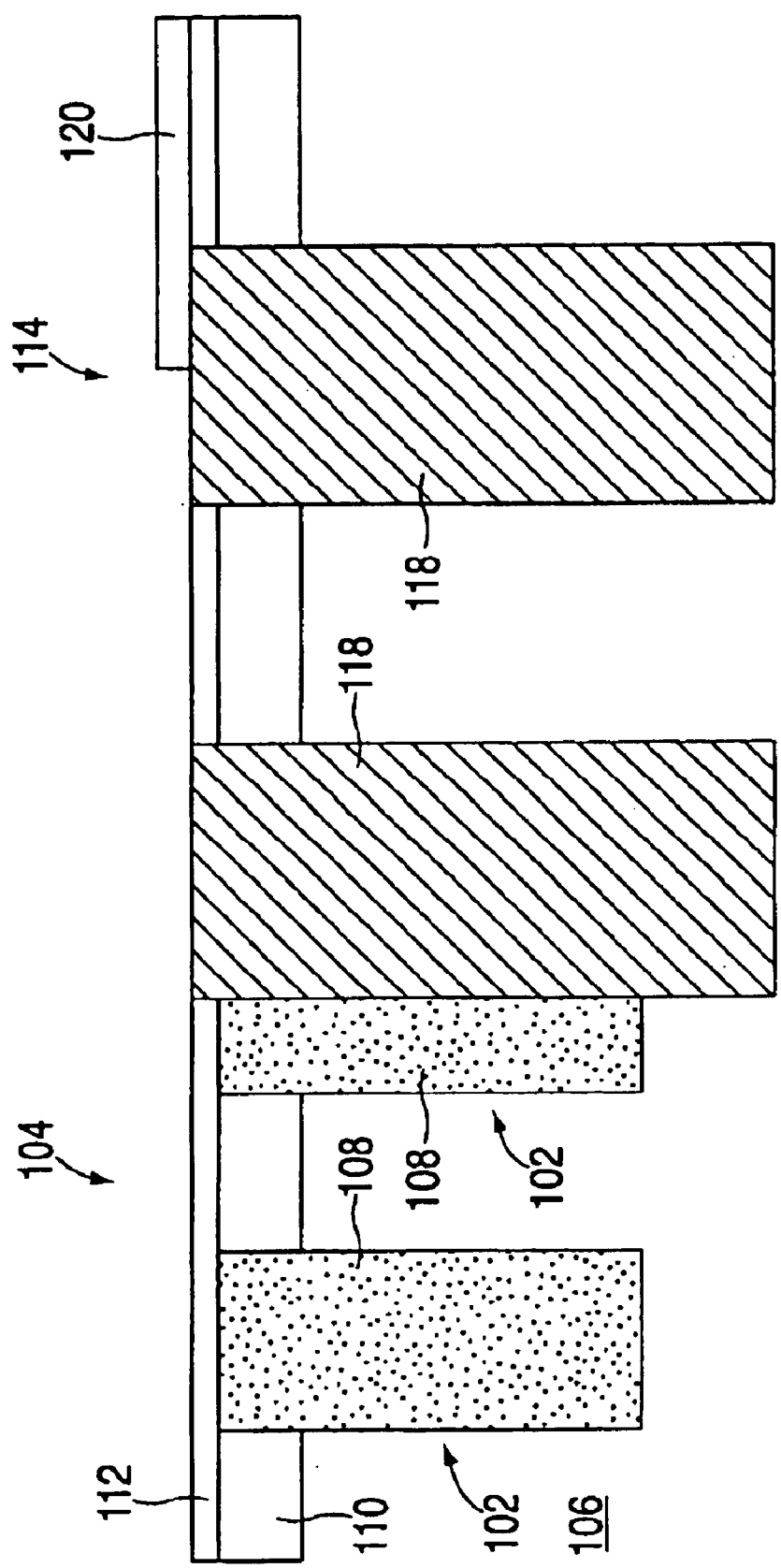

Following the formation of the isolation trenches 118, a cover or cap oxide 120 is formed over both the support and array areas of the wafer structure. However, the support area 114 is then patterned with a photoresist mask (not shown) so that when the cover oxide 120 is subsequently wet-etched from the array area 104, the support area 114 is still covered with the cover oxide 120. This is shown in FIG. 5.

Figure 6:
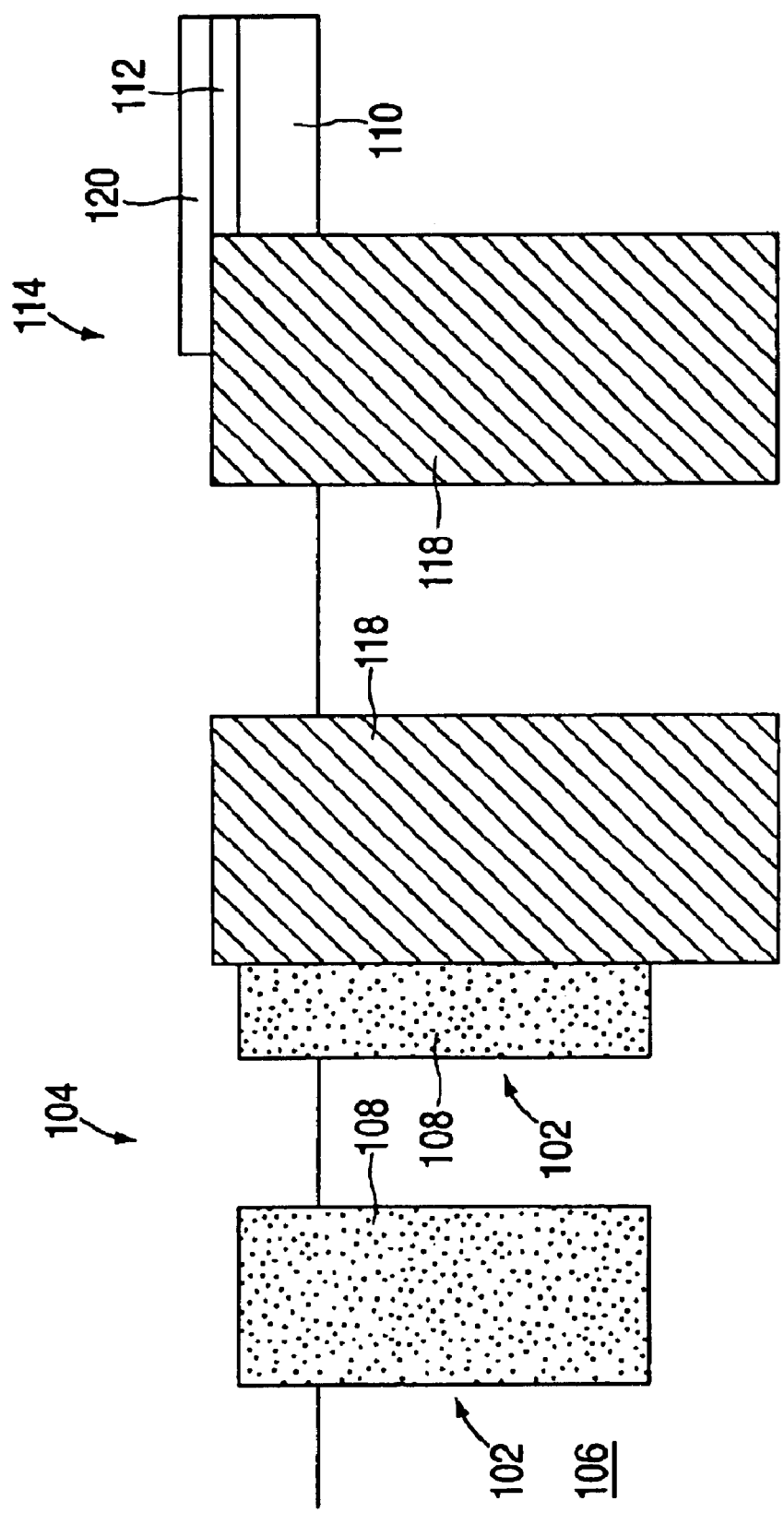
Figure 7:
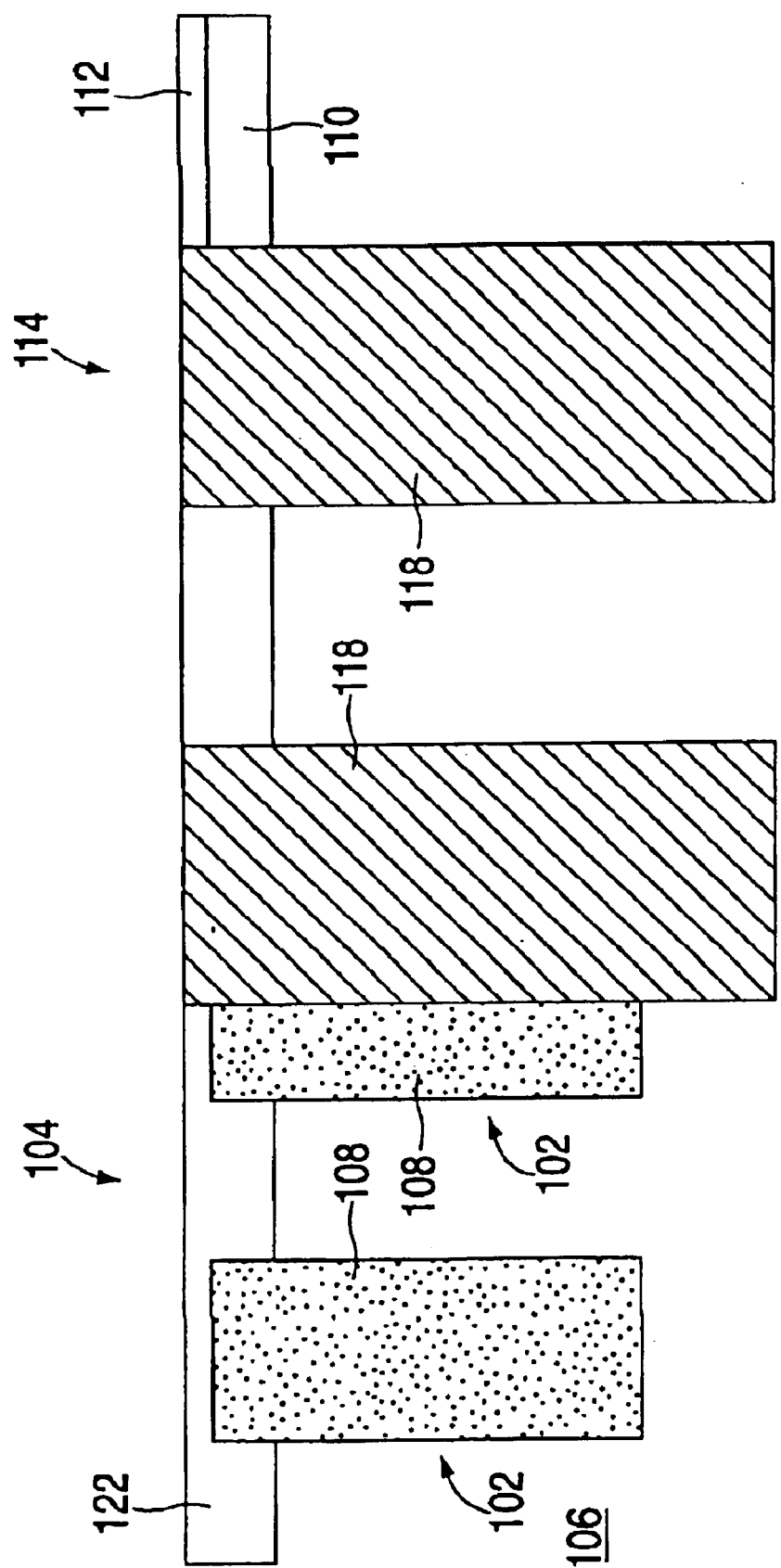

FIG. 6 illustrates the removal of the nitride and pad nitride layers 110, 112 from the array area 104. It will be noted that the nitride and pad nitride layers 110, 112 within the support area 114 are remaining, since they remain covered by cover oxide 120, which resists a nitride stripping process. In FIG. 7, an array top oxide layer 122 is deposited and then planarized. The planarization step also removes the cover oxide 120 over the support area 114, thereby exposing the nitride and pad nitride layers 110, 112 therein.

Figure 8:
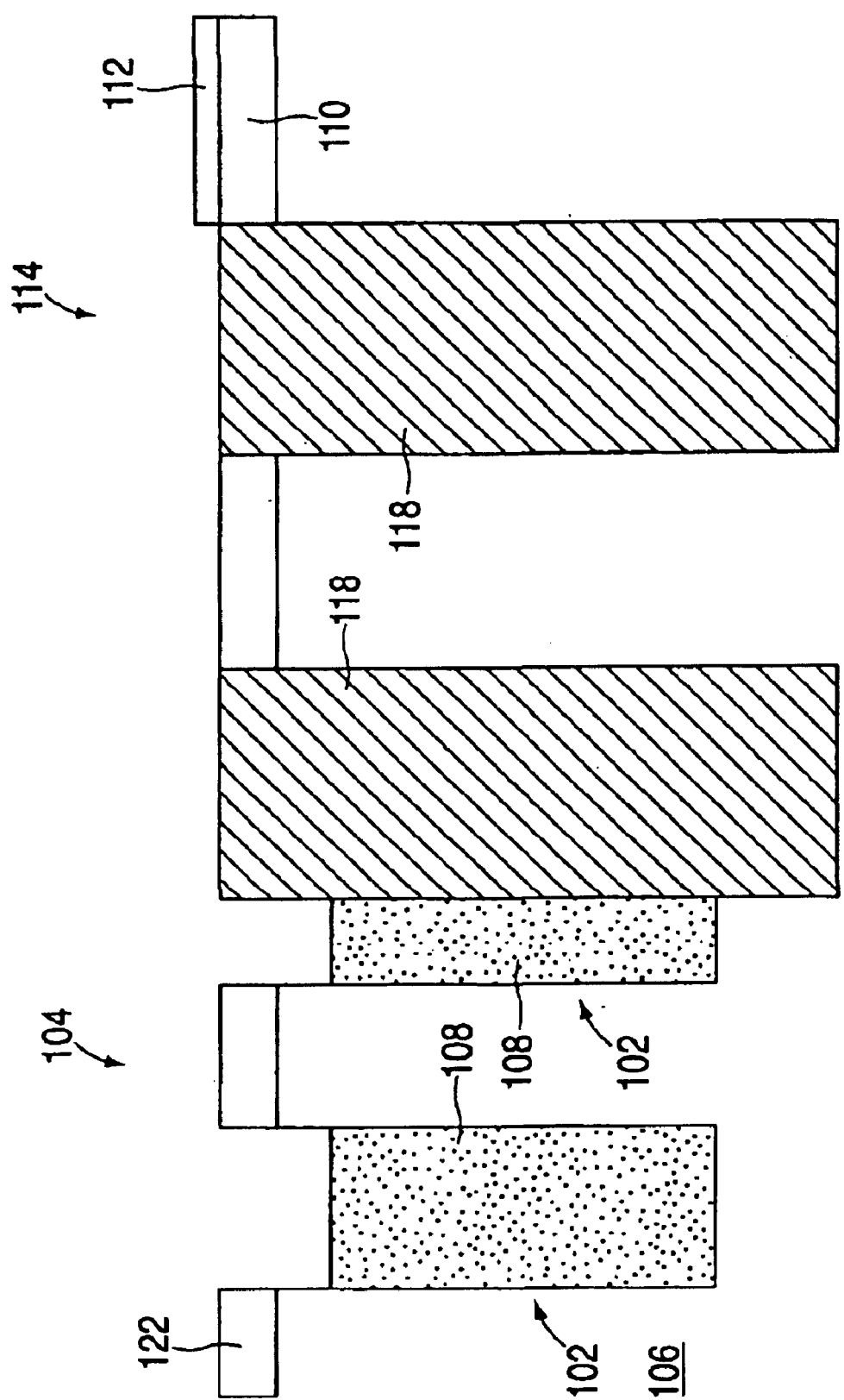

Afterward, an oxide wet etch (with or without a masking step) removes those portions of the array top oxide layer 122 over deep trenches 102. This is done in order to recess some of the polygate material 108 therein, as shown in FIG. 8. Portions of the polygate material 108 are recessed in order for the formation of spacers within the deep trenches.

Figure 9:
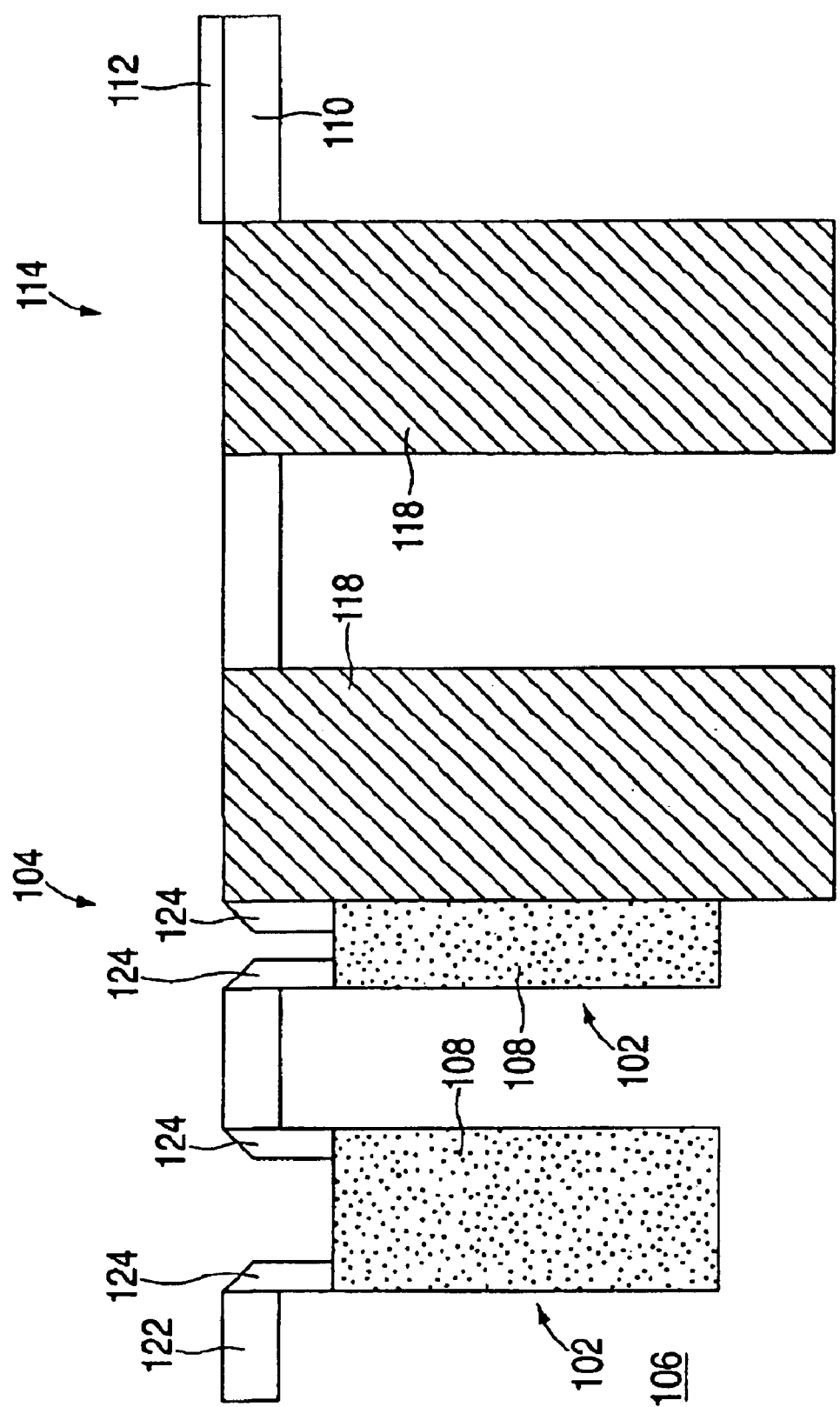
Figure 10:
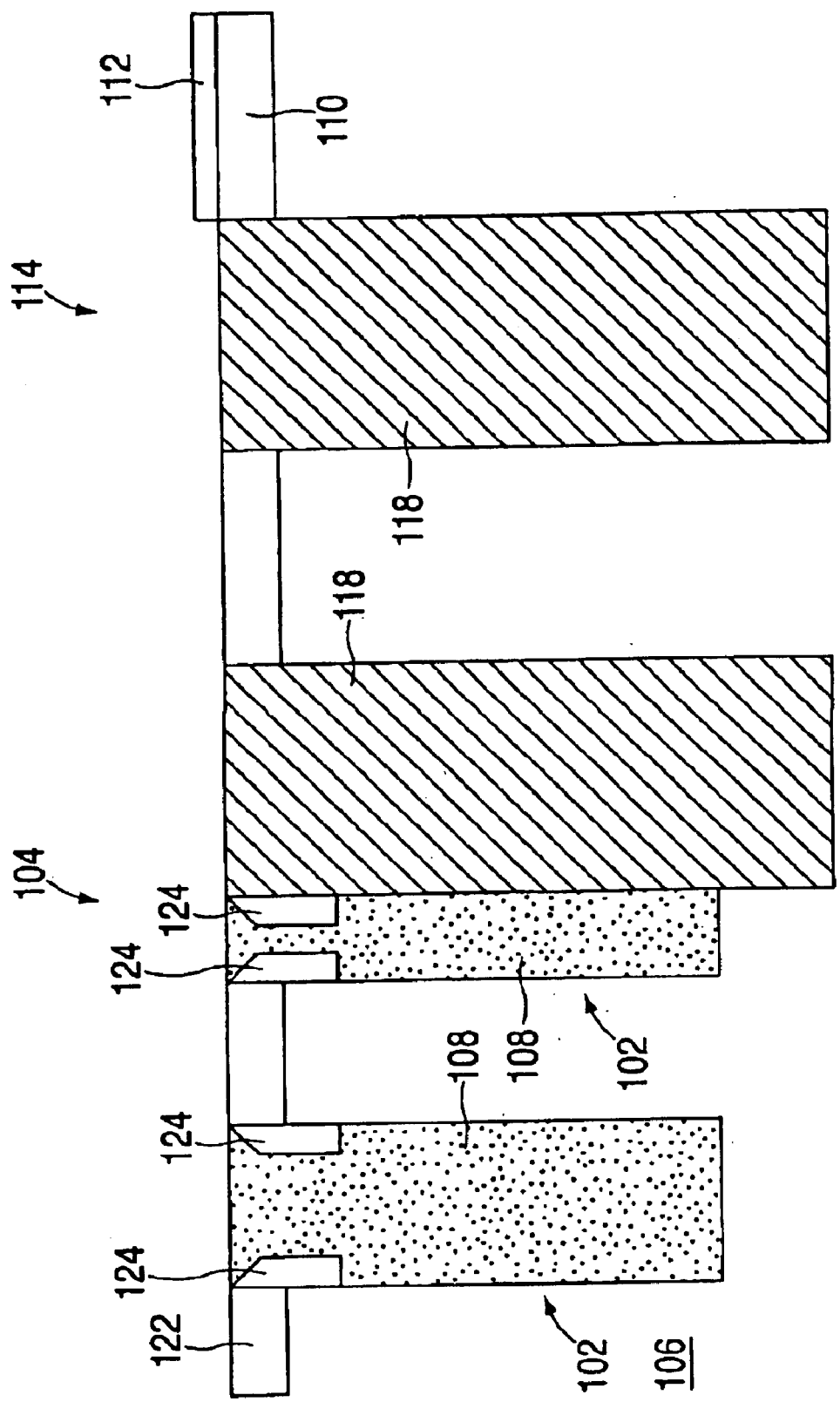

The formation of the spacers 124, preferably silicon nitride (SiN), is illustrated in FIG. 9. After deposition, the nitride spacer material is etched anisotropically, thereby resulting in vertical sidewall spacers within the deep trenches 102. Once the spacers 124 are formed, the deep trenches 102 are filled with additional polygate plug material 108 to define vertical gate contacts therein. The excess polygate plug material 108 is then etched back so that it is planarized with respect to the array top oxide layer 122, as shown in FIG. 10. It should be noted that the spacers 124 may be formed before the formation of the isolation trenches 118 in FIG. 4.

Figure 11:
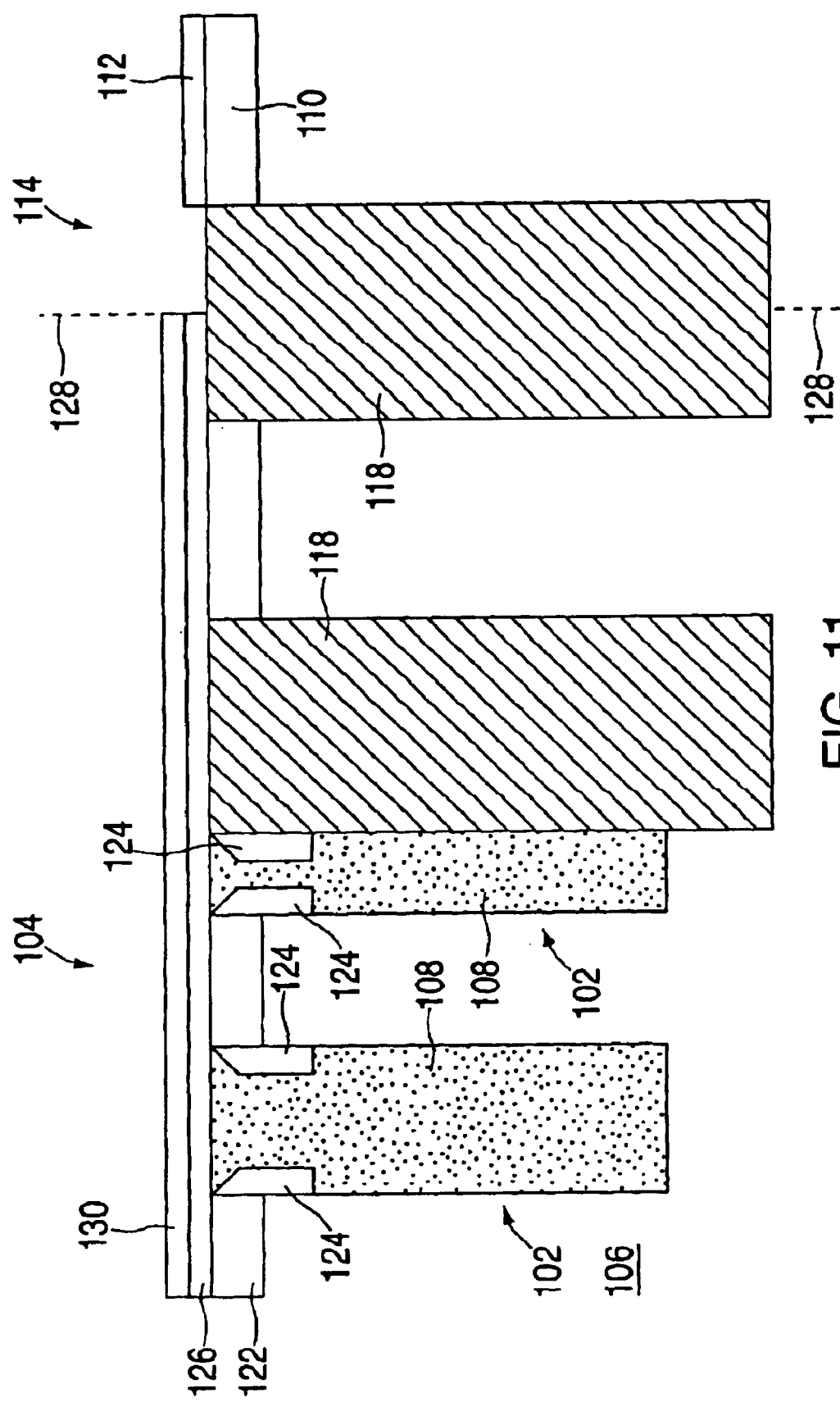
Figure 12:
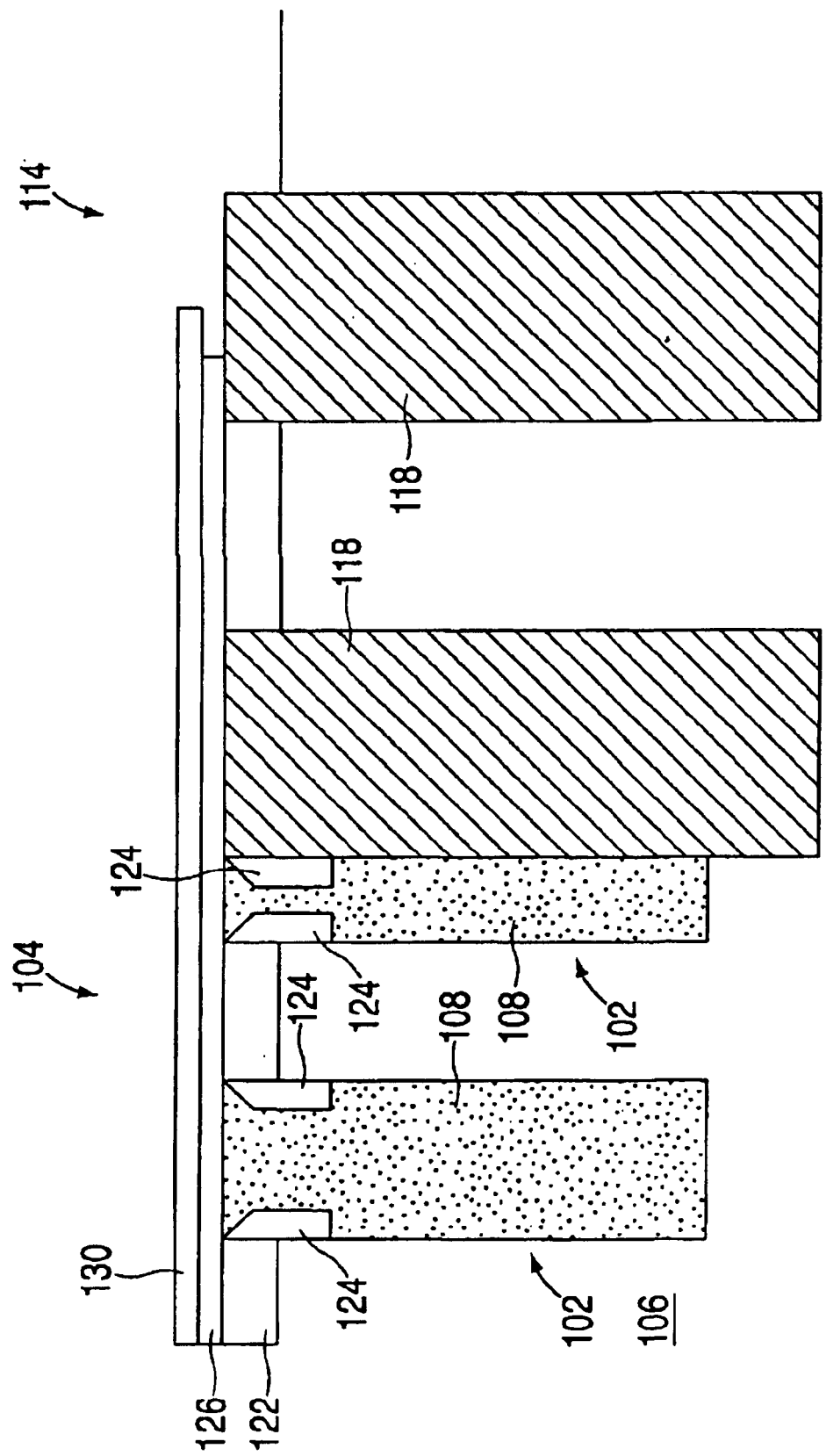

At this point, the nitride and pad nitride layers 110, 112 within the support area 114 may now be removed. Referring to FIG. 11, an array cap nitride layer 126 is deposited over the array area 104, extending to a transition region 128 over the isolation trench 118 bordering the array area 104 and the support area 114. Then, another cap oxide layer 130 is deposited, masked and etched from the support area 114 such that the remaining cap oxide 130 (with pad nitride layer underneath) covers the processed array area 104 and into the transition region 128. In FIG. 12, the nitride and pad nitride layers 110, 112 within the support area 114 are etched away. It will be noted that the nitride etch may result in some lateral removal of the array cap nitride layer 126 under cap oxide layer 130.

Figure 13:
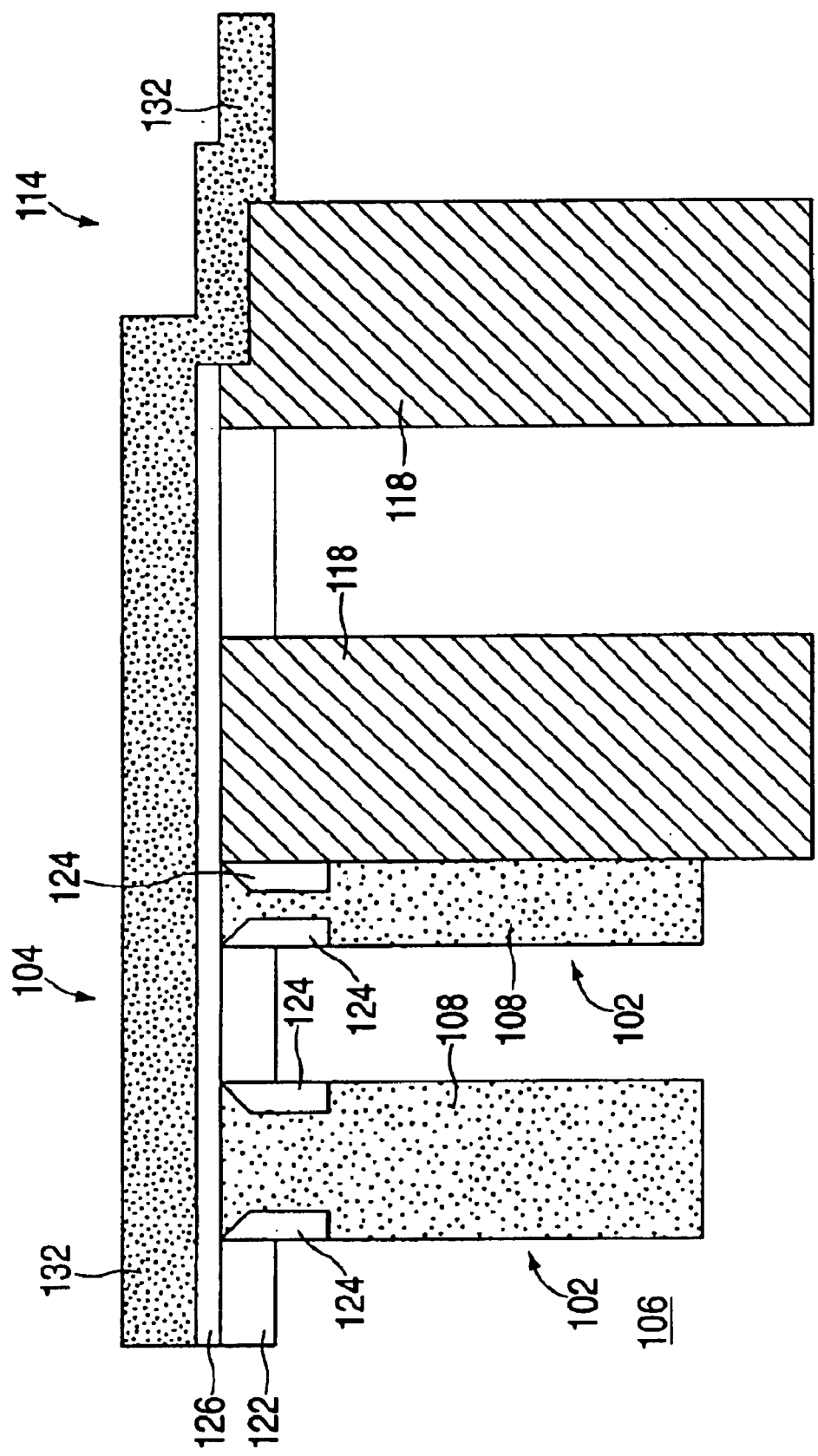

Finally, in FIG. 13, DRAM processing may continue with the support area 114. A polysilicon layer 132 is deposited over the array and support areas following the removal of the cap oxide layer 130 (and nitride and pad nitride layers 110, 112 within support area 114), implantation of diffusion areas and gate oxidation formation. It will be appreciated that by processing the array area 104 while maintaining the nitride and pad nitride layers 110, 112 within the support area 114, the removal of selected areas of top oxide 122 and thus formation of the spacers 124 within the deep trenches 102 may be carried out. In so doing, the present method allows for minimal wet etch exposure of the isolation trenches 118 in the support area 114. Subsequently, the polysilicon layer 132 is eventually removed from the array area 104 and the rest of the device processing steps are carried out, as is known in the art.

Figure 14:
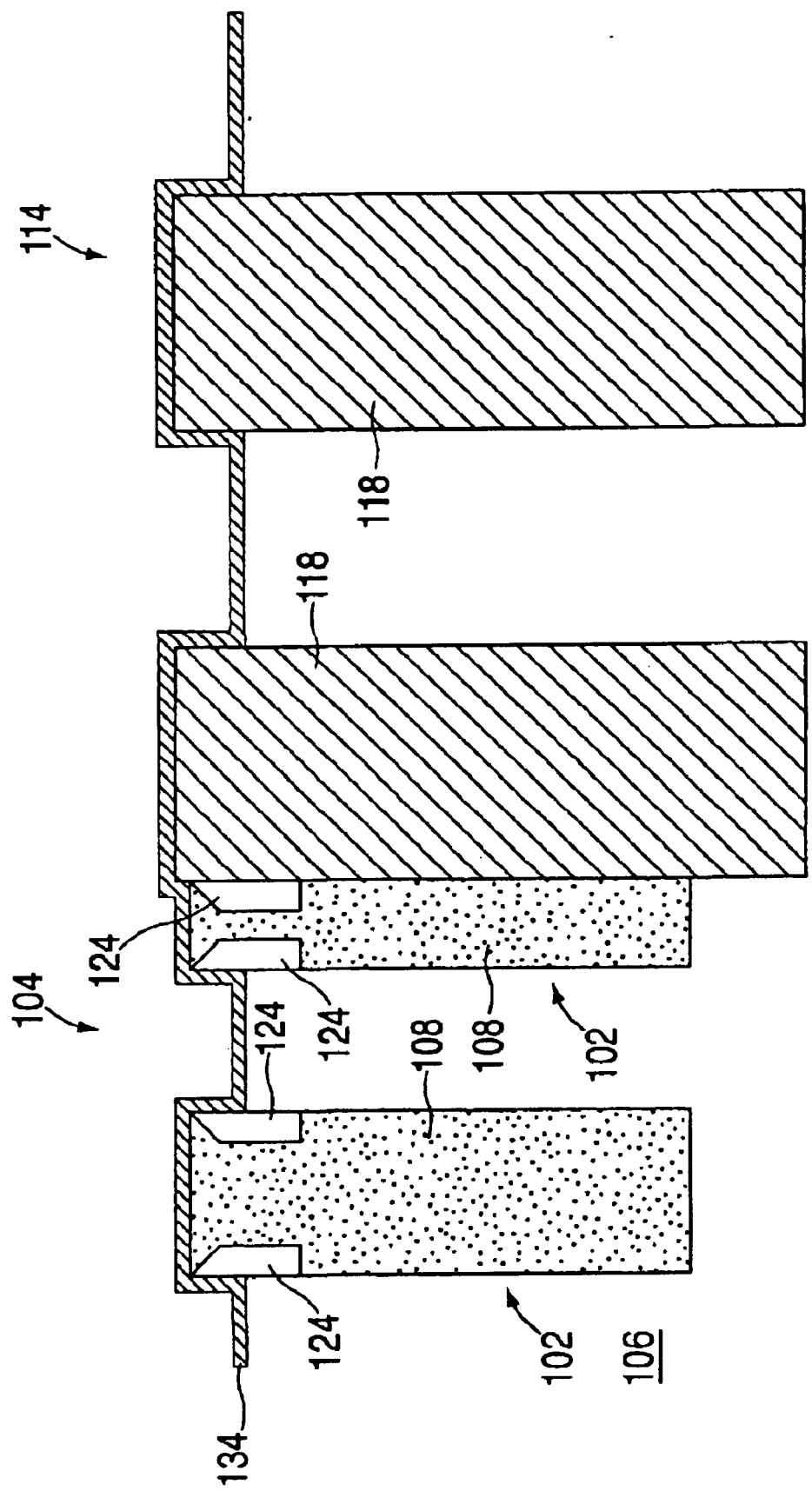
FIGS. 14 and 15 illustrate an alternative embodiment for processing an array top oxide layer.
Figure 15:
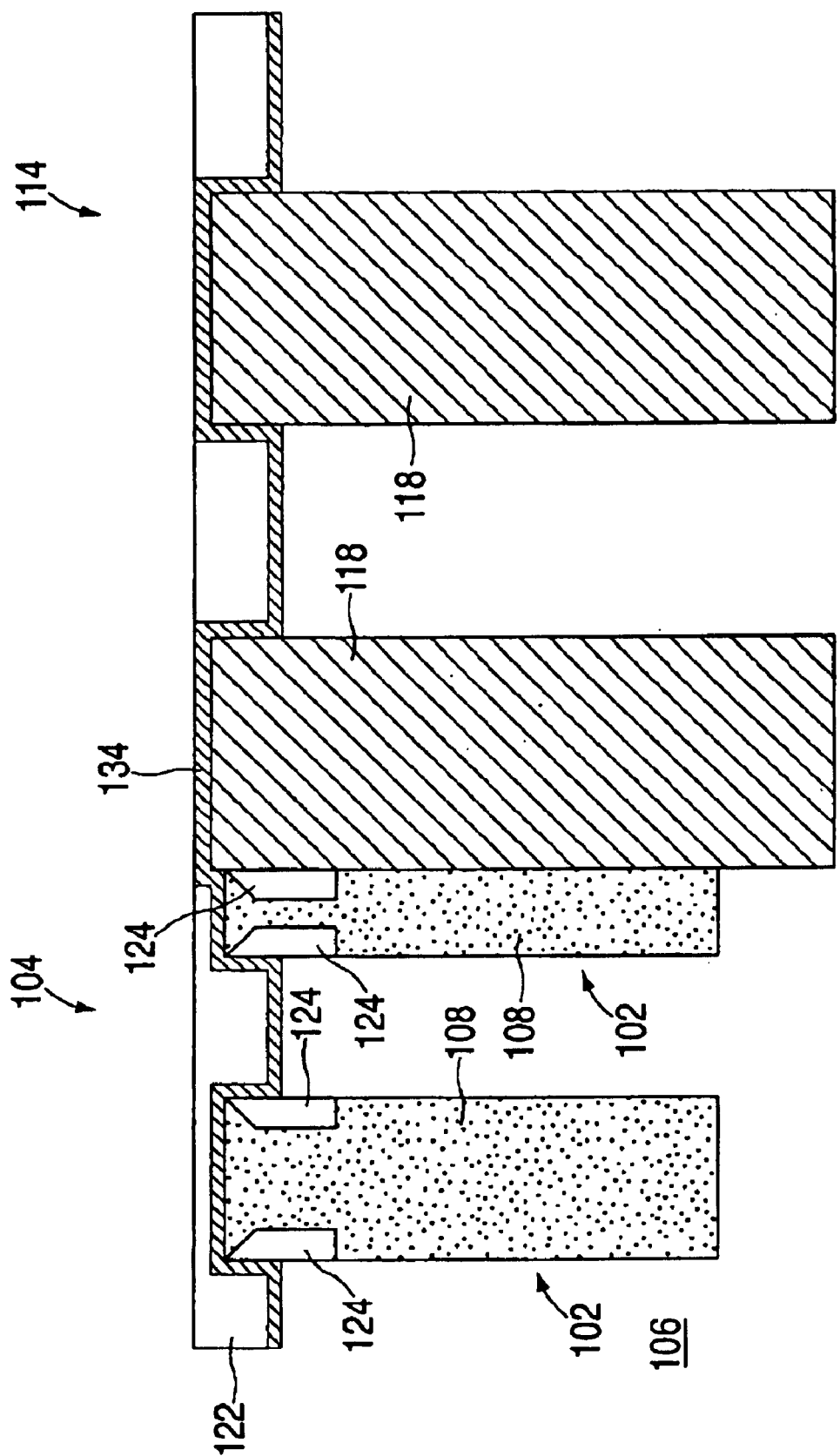

FIGS. 14 and 15 illustrate an alternative embodiment for the formation of the array top oxide layer 122. In FIG. 14, after the isolation trenches 118 are defined and processed (FIG. 4), the nitride and pad nitride layers 110, 112 are etched away. Prior to the deposition of the array top oxide layer 122, however, the spacers 124 are already formed as described above. Then, further array processing steps (e.g., an implantation of dopant species) are carried out, after which a silicon nitride liner 134 is deposited over the array and support areas. In FIG. 15, the array top oxide layer 122 is then deposited and planarized down to (or above) the nitride liner 134 atop the isolation trenches 118. In this embodiment, the support area 114 is protected from wet etching since, when the top oxide 122 is etched from the support area 114, nitride liner 134 provides an etch stop surface. It will further be appreciated that this embodiment differs from the earlier embodiment, in that nitride liner 134 is present under the array top oxide 122.

It should be pointed out that the above-described embodiments of the invention are not limited solely to the fabrication of vertical DRAM cells, or even other types of memory cells for that matter. Rather, the invention embodiments may also be applicable to other types of semiconductor devices having first and second device areas which may be processed differently. For example, FIG. 16 shows a semiconductor device 200 having a first area 202 and a second area 204 defined on adjacent regions of a substrate 205. The first area includes a top oxide layer 206 which may be formed and processed similar to the array area of the above-described embodiments. Likewise, the second area 204 may be processed in a similar manner to the support area of the above-described embodiments. A gate material 208 may be found in both the first and second areas 202, 204. In the second area 204, the gate material 208 is depicted as a gate, such as for an FET, and is formed over a thin gate oxide 210. Conversely, the gate material 208 in the first area 202, being formed over the array top oxide 206, is obviously not used as a gate for an FET but instead may be used, for example, as part of a wiring level. As such, it can be seen that the aforementioned process descriptions have application in other semiconductor devices, in addition to memory devices.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential-scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for processing a semiconductor device, the memory including a first area and a second area thereon, the method comprising:

removing an initial pad nitride material contained within the first area and the second area;

forming active device areas within the first area;

forming a continuous nitride liner over the first area and the second area, said nitride liner further being formed prior to the formation of gate structures within the first area and the second area;

forming a top oxide layer over said nitride liner; and removing, from the second area, said top oxide layer;

wherein said nitride liner serves as stop surface during the removal of said top oxide layer from the second area.

2. The method of claim 1, wherein said top oxide layer is removed from the second area by wet etching.

3. The method of claim 1, further comprising:

prior to said removing an initial pad nitride material contained within the first area and the second area, forming isolation trenches within the first area and the second area.

4. The method of claim 3, wherein said isolation trenches are formed by:

patterning isolation trench openings within the first and second areas;

etching through said initial pad nitride material and a substrate material of the device, thereby forming said isolation trench openings; and filling said isolation trench openings with an oxide material.

5. The method of claim 3, further comprising planarizing said top oxide layer down to said nitride liner located over said isolation trenches.

6. A method for processing a semiconductor memory device, the memory device including an array area and a support area thereon, the method comprising:

removing an initial pad nitride material contained within the array area and the support area;

forming active device areas within the array area;

forming a continuous nitride liner over the array area and the support area, said nitride liner further being formed prior to the formation of gate structures within the array area and the support area;

forming a top oxide layer over said nitride liner; and removing, from the support area, said top oxide layer;

wherein said nitride liner serves as stop surface during the removal of said top oxide layer from the support area.

7. The method of claim 6, wherein said top oxide layer is removed from the support area by wet etching.

8. The method of claim 6, further comprising:

prior to said removing an initial pad nitride material contained within the array area and the support area, forming isolation trenches within the array area and the support area.

9. The method of claim 8, wherein said isolation trenches are formed by:

patterning isolation trench openings within the array and support areas;

etching through said initial pad nitride material and a substrate material of the device, thereby forming said isolation trench openings; and filling said isolation trench openings with an oxide material.

10. The method of claim 8, further comprising planarizing said top oxide layer down to said nitride liner located over said isolation trenches.

* * * * *